United States Patent
Prohofsky (10) Patent No.: US 10,409,736 B2
(45) Date of Patent: Sep. 10, 2019

(54) MULTI-HOST INTELLIGENT BLOCK LEVEL PROVISIONING

(71) Applicant: Seagate Technology LLC, Cupertino, CA (US)

(72) Inventor: Thomas Roy Prohofsky, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/594,777

(22) Filed: May 15, 2017

(65) Prior Publication Data

US 2018/0330768 A1 Nov. 15, 2018

(51) Int. Cl.
| | |
|---|---|
| *G06F 13/16* | (2006.01) |
| *G06F 11/10* | (2006.01) |
| *G06F 3/06* | (2006.01) |
| *G11C 8/12* | (2006.01) |

(52) U.S. Cl.
CPC .............. *G06F 13/16* (2013.01); *G06F 3/061* (2013.01); *G06F 3/064* (2013.01); *G06F 3/067* (2013.01); *G06F 3/0656* (2013.01); *G06F 3/0659* (2013.01); *G06F 11/1076* (2013.01); *G11C 8/12* (2013.01)

(58) Field of Classification Search
CPC ..... G11C 7/1057; G11C 8/12; G11C 2216/16; G11C 2216/26; G06F 11/00; G06F 12/00; G06F 13/14; G06F 17/00; G06F 17/30
USPC .................................................... 365/189.05
See application file for complete search history.

(56) References Cited

U.S. PATENT DOCUMENTS

| | | | |
|---|---|---|---|
| 6,883,065 B1 | 4/2005 | Pittelkow et al. | |
| 7,003,688 B1 | 2/2006 | Pittelkow et al. | |
| 7,631,155 B1 | 12/2009 | Bono et al. | |
| 7,747,836 B2* | 6/2010 | Rajan | G06F 3/0605 711/203 |
| 8,285,758 B1* | 10/2012 | Bono | G06F 16/119 707/822 |
| 8,364,638 B2 | 1/2013 | Nickolov et al. | |
| 8,433,685 B2 | 4/2013 | Hayden et al. | |
| 8,700,634 B2* | 4/2014 | Apte | G06F 16/1748 707/741 |
| 2012/0185447 A1* | 7/2012 | Zhang | G06F 16/278 707/693 |
| 2012/0330903 A1* | 12/2012 | Periyagaram | G06F 3/0608 707/692 |

* cited by examiner

*Primary Examiner* — Sung Il Cho
(74) *Attorney, Agent, or Firm* — Hall Estill Attorneys at Law (57) ABSTRACT

A first data storage device may be connected to first and second entities as part of a distributed network with each entity having direct block level access to logical block addresses of the first data storage device. The first data storage device can consist of a provisioning module and a staging buffer with the provisioning module configured to store and acknowledge non-volatile write data in the staging buffer in response to a write request to any logical block address of a range of logical block addresses in the first data storage device. The provisioning module may return previously committed data resident in the range of logical block addresses instead of the write data resident in the staging buffer until a commit signal is received from at least one entity for the write data.

20 Claims, 5 Drawing Sheets

| | | 0 | 8 | 16 | 24 | 0 | 8 | 16 | 24 |
|---|---|---|---|---|---|---|---|---|---|
| 0 | 63 | STATE | CREATED | COUNT DOWN | CLASS | RESOURCE ID | | | |
| 64 | 127 | DEP LBA | SIZE+ | DEP LBA | SIZE+ | DEP LBA | SIZE+ | DEP LBA | SIZE+ |
| 128 | 191 | DEP LBA | SIZE+ | DEP LBA | SIZE+ | DEP LBA | SIZE+ | DEP LBA | SIZE+ |
| 192 | 255 | OWNER: HOST ID | | | | OWNER: HOST ID | | | |
| 256 | 319 | WAITING: HOST ID | | | | WAITING: HOST ID | | | |
| 320 | 383 | WAITING: HOST ID | | | | WAITING: HOST ID | | | |
| 384 | 447 | WAITING: HOST ID | | | | WAITING: HOST ID | | | |
| 448 | 511 | WAITERS | LINK LBA | | | | | | |

FIG. 13

MULTI-HOST INTELLIGENT BLOCK LEVEL PROVISIONING

SUMMARY OF THE INVENTION

A data storage system, in accordance with some embodiments, consists of a first data storage device connected to first and second entities as part of a distributed network with each entity having direct block level access to logical block addresses of the first data storage device. The first data storage device has a provisioning module and a staging buffer with the provisioning module configured to store and acknowledge non-volatile write data in the staging buffer in response to a write request to any logical block address of a range of logical block addresses in the first data storage device. The provisioning module returns previously committed data resident in the range of logical block addresses instead of the write data resident in the staging buffer until a commit signal is received from at least one entity for the write data.

Various embodiments arrange a data storage system with first and second entities each connected to a data storage device as part of a distributed network with each entity having direct block level access to logical block addresses of the data storage device. The data storage device consists of a provisioning module and a staging buffer. A first non-volatile data packet is stored in the staging buffer as directed by the provisioning module in response to a write request to any logical block address of a range of logical block addresses in the data storage device. The provisioning module acknowledges the first non-volatile data packet and then returns previously committed data resident in the range of logical block addresses instead of the first non-volatile data packet resident in the staging buffer until a first commit signal is received from the first or second entity.

In other embodiments, a data storage system has first and second entities each connected to a first data storage device and a second data storage device as part of a distributed network with each entity having direct block level access to the first data storage device. The first data storage device having a provisioning module connected to a staging buffer that stores a first data packet as directed by the provisioning module in response to a write request from the first entity. Receipt of a first commit signal from the first or second entity prompts the first data packet to be moved from the staging buffer to non-volatile memory of the first data storage device. A second data packet is stored in the staging buffer as directed by the provisioning module in response to a second write request from the second entity with the first and second data packets each designated by the provisioning module to a common logical address. Comparison of the first data packet present in the non-volatile memory to the second data packet allows less than all of the second data packet to be written to the non-volatile memory of the first data storage device in response to a second commit signal from the first or second entity.

DETAILED DESCRIPTION

As the networking capabilities of computing devices have advanced, bottlenecks in performance have occurred that have yet to be addressed by the data storage industry. While the connection of a data storage device to a remote host via a wired, or wireless, network can provide decent data storage speed and protection, the incorporation of multiple hosts, data storage devices, and distributing network entities can be bottlenecks that inhibit the network from reaching maximum data storage performance. Hence, various embodiments are directed to a multi-host data storage system where data provisioning is intelligently conducted to mitigate performance bottlenecks.

Data manipulating applications deployed at large scale correspond with data availability and performance across multiple hosts connected to systems housing bulk block storage devices. These systems provide logical aggregation of the block storage and potential access control while becoming bottlenecks of performance and limit the number of bulk storage devices that can participate in aggregation of a logical construct. They rely on managing state of concurrent reads and writes from multiple hosts that span multiple devices. Moving the intermediate update state to the block device enables availability and performance to scale without intermediate controller performance bottlenecks.

Figure 1:
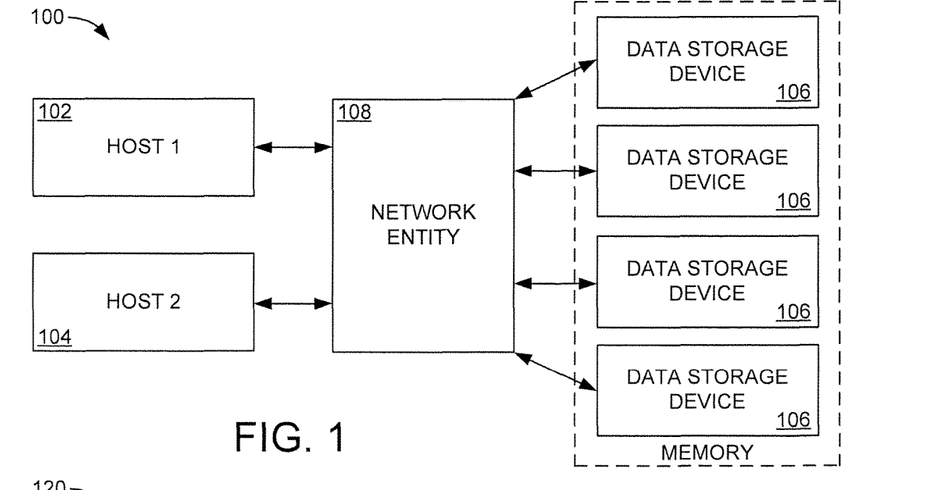
FIG. 1 is a block representation of a portion of an example data storage system arranged in accordance with various embodiments.

FIG. 1 displays a block representation of an example data storage system 100 where assorted embodiments of this disclosure can be practiced. The data storage system 100 has multiple hosts 102 and 104 that can write data to, and read data from, one or more data storage devices 106. It is contemplated that the data storage device 106 can be any type, size, and physical location, such as a hard disk drive (HDD) with a rotating magnetic media, a solid-state memory array, or a hybrid combination of the two. The hosts 102/104 are also not limited to a particular configuration and can be any computing component, such as a controller, network node, server, or switch.

Although a host 102/104 can connect directly to a data storage device 106, data storage systems can be setup as distributed networks where multiple data storage devices 106 and hosts 102/104 are all physically separated. Such distributed networks can utilize one or more network entities 108, such as a network controller, server, or switch, to organize, provision, and distribute data between the data storage device(s) 106 and the hosts 102/104. A network entity 108 allows for some distributed data protections, such as using striping, parity, and mirroring of data as part of a redundant array of independent devices (RAID).

When a single network entity 108 is positioned between a data storage device 106 and a single host 102, the entity can efficiently receive, provision, and direct data access requests, such as data reads, data writes, and data updates. However, the incorporation or multiple hosts 102/104 and multiple network entities 108 stress the data throughput of the respective entities 108. For instance, the entities 108 can suffer from synchronization issues when servicing data access requests from one or more hosts 102/104.

While it is contemplated that the entities 108, or hosts 102/104, may be logically locked together, such as with a mutually exclusive control objects, to handle data access requests from multiple hosts 102/104, such locked configuration creates a performance bottleneck as the data throughput of the locked entities 108 are reduced compared to dual, independently operating network entities 108. It is noted that with the advancement of data storage device interface, channel, and bus technology, such as with serial attached SCSI (SAS) or non-volatile memory express (NVMe) over Fabrics like Ethernet and Infiniband, the data access request servicing capabilities of the data storage device 106 is greater than the network entities 108. Accordingly, various embodiments are directed to providing each host 102/104 and network entity 108 with block level input/output (I/O) command access to each data storage device 108 to allow the respective data storage devices 106 to conduct provisioning and execution of data access requests.

Figure 2:
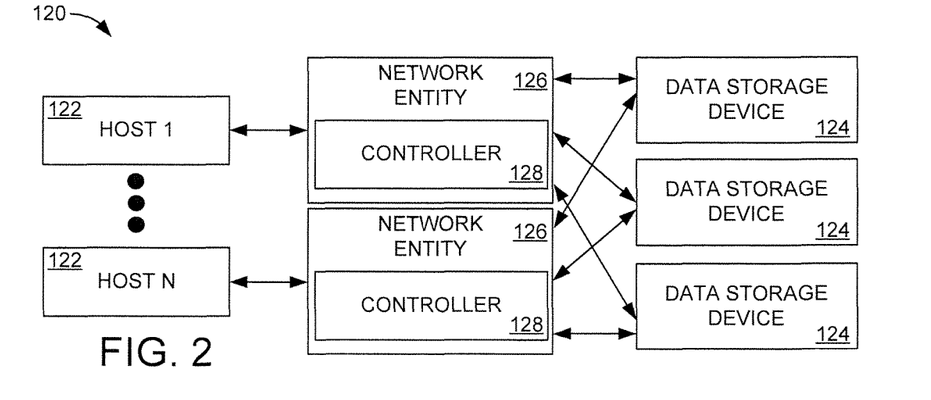
FIG. 2 displays a block representation of a portion of an example data storage network capable of being used in the data storage system of FIG. 1.

FIG. 2 illustrates an example data storage network 120 that may be a part of the data storage system 100 of FIG. 1 in some embodiments. The data storage network 120 can connect any number of hosts 122 (1-N) with any number of data storage devices 124 via any number of network entities 126. Hence, the number and configuration of the data storage devices 124 and entities 126 in FIG. 2 are not limiting or required.

It is noted that any of the network entities 126 can be hardware or software-based. That is, a network entity 126 can have a controller 128 that is part of a physical network printed circuit board or a virtualized aspect of software executed by a local, or remote, processor. Although the presence of software and hardware network entities 126 can coexist and service requests from/to the hosts 122, there is no effective synchronization between the hosts 122, particularly in RAID data storage arrangements. The lack of effective synchronization can be alleviated, in accordance with some embodiments, by allowing block level I/O command access to the respective hosts 122.

With each host 122 having block level I/O command access, the respective data storage devices 124 can provide concurrent, synchronized data accesses and control between loosely coupled hosts 122. In other words, block level I/O command access for each host 122 relocates data provisioning to the respective data storage devices 124 from the network entities 126, which allows the increased data throughput capabilities of the devices 124 to be utilized without overloading the entities 126. The multiple host synchronization provided by the network 120 employing host block level I/O command access allows for at least the following commands and operations: multi-host mode enable/disable, physical device metadata for cluster initialization and host registration, logical volume metadata access controls, two-phase commit for write staging, read access delay for data address contentions, pending write usage reports, and atomic conditional set/get for lock acceleration.

Figure 3:
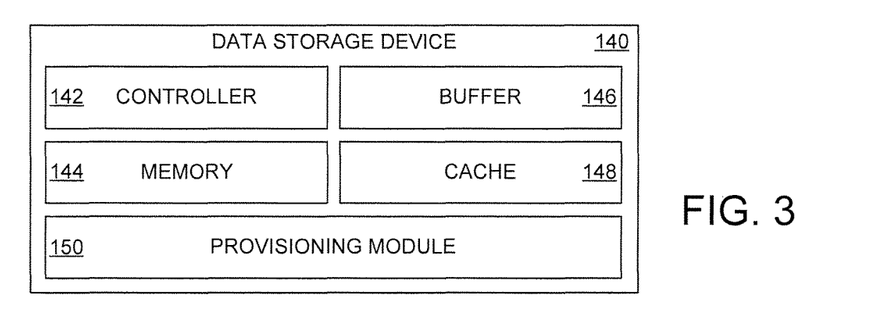
FIG. 3 shows a block representation of a data storage device that may be employed in the data storage system of FIG. 1.

Though not required or limiting, FIG. 3 depicts an example data storage device 140 that may be used in the data storage network 120 and system 100 of FIGS. 1-2. The data storage device 140 can have one or more local controllers 142, such as a microprocessor or programmable controller, that organizes, provisions, and executes data access operations to, and from, a local memory 144. The memory 144 may consist of rotating magnetic media and/or a non-volatile solid-state memory array.

The data storage device 140 can have one or more temporary memories that can be volatile or non-volatile. For instance, a non-volatile buffer 146 can provide a data capacity that is less than the permanent memory 144 and a volatile cache 148 can provide short-term data storage that has less data latency than the buffer 146. Incorporation of a provisioning module 150 allows the local controller 142 to intelligently utilize the memory 144, buffer 146, and cache 148 to optimize data flow through the buses, interfaces, and channel, such as with an NVMe specification, to service the block level I/O commands from any number of network hosts.

Figure 4:
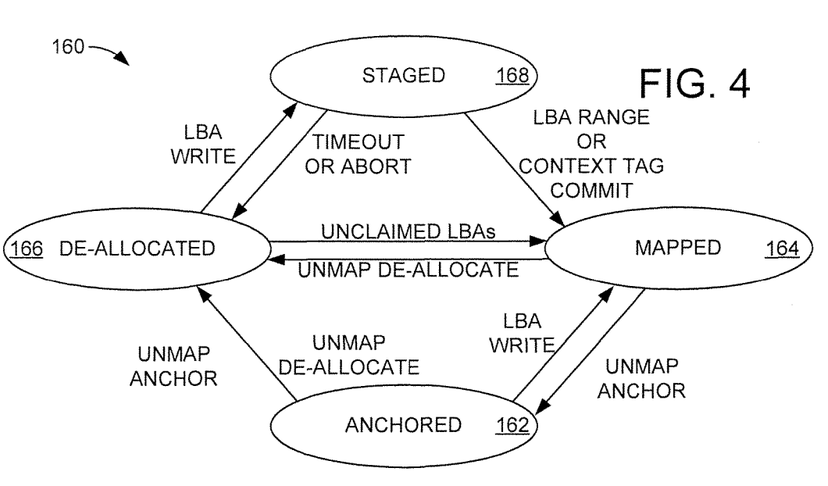
FIG. 4 illustrates a block representation of an example provisioning module scheme that can be utilized in the data storage device of FIG. 3.

FIG. 4 conveys a block representation of a logical block provisioning scheme 160 carried out by a provisioning module 150 of a data storage device. It is contemplated that data access requests are handled in accordance with a T10 standard by a local controller. When network entities, or hosts, provision data and provide a logical block address (LBA) for data, the data can be in an anchored 162, mapped 164, and de-allocated 166 state. The three data states can be utilized to carry out data access requests when LBAs are previously provisioned. However, block level I/O access by a host does not pre-provision an LBA, which is accommodated by initially storing data in a buffer memory as a staged state 168.

As shown, a data access request may timeout or abort from the staged state 168 to the de-allocated state 166. A data write request can advance from the de-allocated state 166 to the staged state 168 where data can await the local controller, or a network host, to provide an LBA range, context tag, and/or commit tag that advances the request to the mapped state 164.

In contrast to a data management via three states without the staged state 168, the provisioning module can map unclaimed LBAs from the de-allocated state 166 and/or de-allocate unmapped data requests from the mapped state 164. The ability to map previously de-allocated unclaimed LBAs allows the provisioning module to more effectively utilize available memory, such as in wear leveling solid-state die or organizing data into sequential LBAs.

Figure 5:
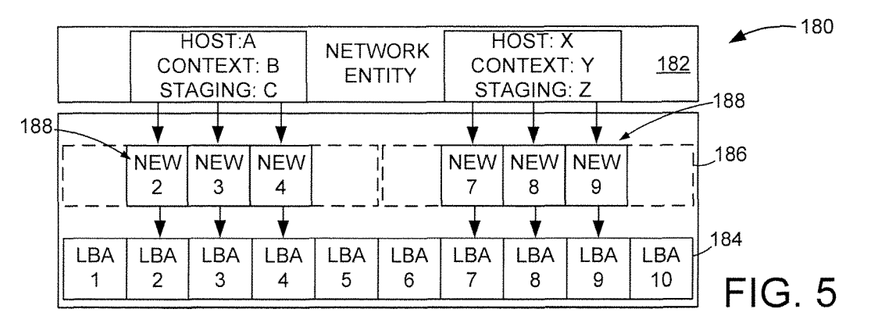
FIG. 5 represents a portion of an example data storage network constructed and operated in accordance with assorted embodiments.

It is to be understood that the multiple data states displayed in FIG. 5 are meant as logical block provisioning states organized and executed at least by the provisioning module 150 of a data storage device. As such, data in a distributed network with multiple different data storage devices may concurrently have data is different logical block provisioning states, which allows for faster data access execution and reduced performance bottlenecks for the network entities and hosts.

FIG. 5 displays a block representation of a portion of an example data storage network 180 that may be employed as part of the data storage system 100 of FIG. 1. In the example of FIG. 5, a single network entity 182 services two separate data access writes to memory 184 in a distributed network, which can be LBAs located in one or more different data storage devices. It is noted that data access writes can be serviced by a provisioning module of a single data storage device or several different provisioning modules from multiple data storage devices.

While not required or limiting, use of provisioning modules in the respective data storage devices, instead of the network entity 182, allows the faster bus structure and data protocol available in the data storage device to provide two phase commit execution of a data write. When a data access write request is generated by a host, phase one stages the data associated with the write request in a non-volatile staging buffer 186 located in one or more data storage devices separate from the network entity and host. That is, the storage of the write request data in the staging buffer 186 corresponds with no temporary or permanent storage of the write data in the host or network entity 182, which means the host and entity 182 essentially pass-through write data to the data storage device(s) without processing, provisioning, or assigning the write data to particular LBAs.

It is contemplated that the staging buffer 186 of each of the respective data storage devices can be directly accessed by a host and/or network entity 182 without the data storage device authorizing or provisioning the incoming data. Once pending write data is in the staging buffer 186, as illustrated by the data packets 188 located in the segmented box, the data storage device(s) constituting the memory 184 can acknowledge the buffer 186 holds data awaiting provisioning. It is noted that data from host X can be transferred from the network entity 182 to the staging buffer 186 in one or more transfers. The data received by the staging buffer 186 can be positively acknowledged during the incoming transfer and persistently through the memory 184 reset and power cycle.

The device acknowledgment of pending write data in the staging buffer 186 allows the provisioning module of the data storage device to service data read requests for the write data by responding with the old data existing in memory 184 or the new data resident in the staging buffer 186. In other words, the provisioning module acknowledging the pending write data in the staging buffer 186 can result in a data access read request to return the data of the memory 184 or the new data of the staging buffer 186 that is designated to replace the data in the memory 184. Some embodiments execute a comparison of old and pending data, such as with an exclusive or (XOR).

The ability to return old or new data in response to a read request allows the provisioning module to maintain data in the staging buffer for any length of time without concern for data read access request queue volume. Indeed, it is contemplated that the provisioning module maintains new write data in the staging buffer 186 for any length of time, such as until device processing is low or the staging buffer is full. By positioning new, pending write data in the staging buffer 186, additional data updates can easily be accommodated by replacing data in the staging buffer 186 instead of going through the process of provisioning and executing data writes to the memory 184.

In some embodiments, the pending write data of the staging buffer 186 will have at least host, context, and staging tags that respectively distinguish the origin, version, and provisioning information. The distinct tags provide organization for the provisioning module so that pending write data from multiple different hosts and entities can be concurrently stored in the staging buffer 186 and tracked.

In the event a host sends a commit command to the provisioning module, all data storage devices with pending data writes in the staging buffer 186 are switched to a different context tag and are subsequently provisioned by the provisioning module as part of being written to the memory 184. Each host with access to the memory 184 can have one or more staging tags in use receiving updates while commits for prior staged data writes are being issued.

It is contemplated that a host may issue a commit command for less than all the pending data writes in the staging buffer, but a single commit command can simultaneously issue to multiple different provisioning modules and data storage devices to service data writes with a particular RAID level, such as 0, 1, or 5, which can involve striping, mirroring, and parity across multiple different data storage devices. The issuance of the commit command by a host corresponds with the provisioning module considering the new, pending data of the staging buffer 186 as old data that replaces any old versions of the data resident in the memory 184. Hence, a read access request for the data will return the data of the staging buffer 186 and not the data of the memory 184, which eliminates the comparison of old and new data to determine what version is the most current.

Figure 6:
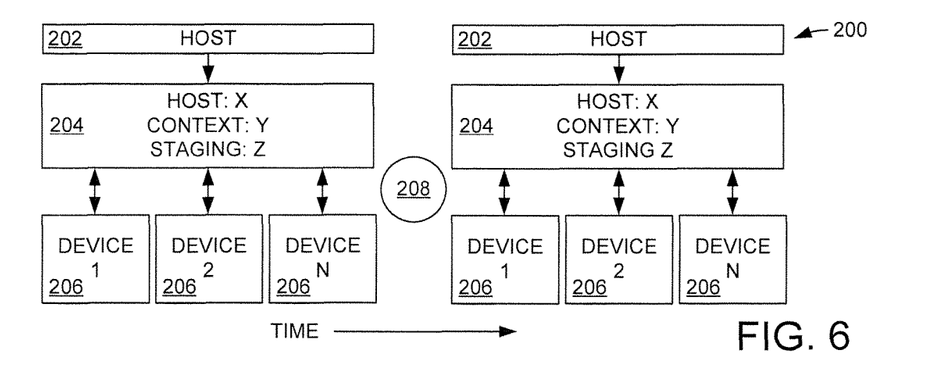
FIG. 6 depicts a portion of an example data storage network constructed and operated in accordance with some embodiments.

FIG. 6 conveys a portion of an example data storage network 200 from the perspective of a host when the network 200 is incorporated into a data storage system in accordance with various embodiments. The host 202 initially issues a data access write request with a block level address designated by the host. The write request also has host, context, and staging tags. One or more network entities 204 send the data of the write request to the data storage device(s) 206 designated by the block level address provided by the host 202, which completes phase one of a data write with regards to the host 202.

At some time after the write data being stored in the data storage device(s) 206, the host 202 issues a commit command 208 that acknowledges the pending write data and indicates that the provisioning module of the respective devices 206 are to provision and write the data to permanent memory. With the commit command 208 issued, the host 202 and network entities 204 can proceed to service other network activities, such as data reads and maintenance, without being bogged down with the data processing, provisioning, and request execution operations carried out by the provisioning modules of the respective data storage devices 206.

Figure 7:
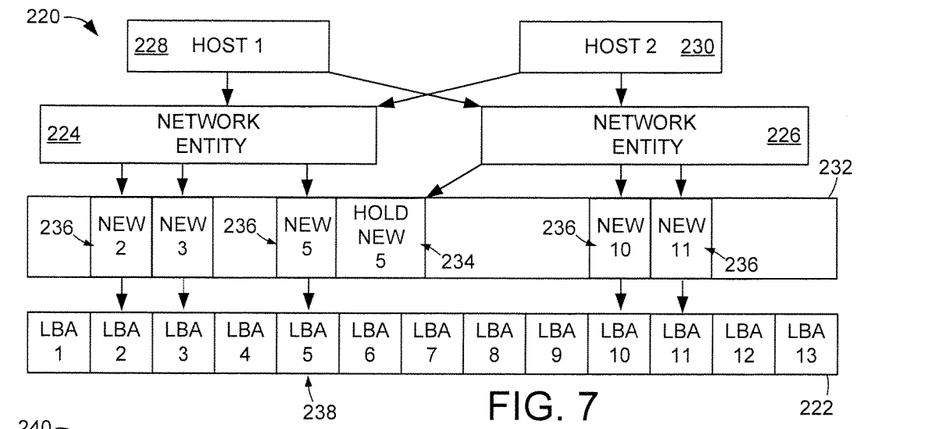
FIG. 7 conveys a portion of an example data storage network constructed and operated in accordance with various embodiments.

While the structure and operation of provisioning modules in a distributed network can service a single host 202 and network entity 204, the practical optimization in network 200 performance is experienced when multiple hosts 202 and/or network entities 204 are concurrently issuing data access requests to network memory. FIG. 7 displays a block representation of a portion of an example data storage network 220 that can be part of the data storage system 100 of FIG. 1. Much like FIG. 5, the data storage network 220 has a memory 222 that consists of a number of different LBAs distributed over one or more data storage devices. The memory 222 has at least one corresponding provisioning module located in each data storage device that services data access requests from multiple network entities 224/226 and multiple hosts 228/230.

In the non-limiting embodiment of FIG. 7, each host 228 and 230 issues a multiple data access write requests to the memory 222. As shown, the data requests from the respective hosts 228/230 have different host, context, and staging tags that allow provisioning module(s) of the respective data storage device(s) of the memory 222 to hold data of data requests directed to LBAs with pending data in a staging buffer 232. That is, with the hosts 228/230 having direct block level addressing capabilities, a provisioning module can detect that multiple hosts 228 have directed data to the same LBAs of the memory 222 and hold the data from one host 230.

It is noted that data that is held is stored in the staging buffer 232, but is not acknowledged as pending for read requests. The holding of data may occur for a variety of reasons designated by the provisioning module, such as data write request timing, write request size, or volume of pending write requests in the staging buffer 232. In other words, data writes 234 to LBAs with pre-existing data 236 resident in the staging buffer 232 are not accessible for future read, or write, accesses until the pre-existing data 236 has been committed via a commit command from the host 228 as long as the context tag of the pre-existing data 236 is newer than the held data 234.

It is contemplated that if the context tag of the held data 234 is newer than the pre-existing data 236, the held data 234 can be compared to the pre-existing data 236, such as via an XOR, in response to a read access request for the data of the LBAs 238 corresponding to the held data. Thus, the provisioning module can hold data, compare different sets of data, and sequentially service multiple write requests to a particular LBA range 238 without occupying the channel, bus, and processing capabilities of the hosts 228/230 and network entities 224/226.

Figure 8:
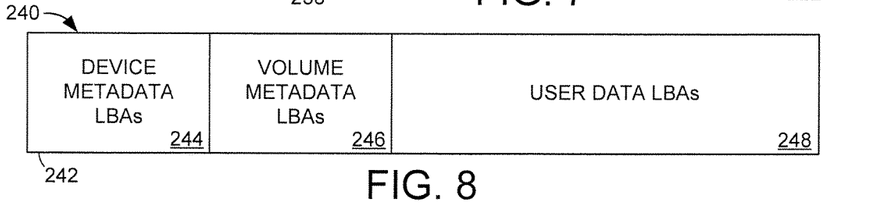
FIG. 8 illustrates a block representation of a portion of an example data storage network utilized in accordance with assorted embodiments.

FIG. 8 illustrates a block representation of a portion of an example data storage network 240 with a memory space 242 that can consist of any number of separate data storage devices as part of a distributed network. The memory space 242 can have any range of logical block addresses that can store user data as well as metadata. It is noted that user data is considered data generated by an end-user not related to the structure, function, operation, and performance of a data storage device and/or network while metadata can be any data related to the structure, function, operation, and performance of a data storage device and/or network.

A provisioning module of a data storage device can designate particular LBA ranges as metadata only regions, such as regions 244 and 246, that are separate LBAs than the user data LBAs of region 248. The metadata designation by the provisioning module may further categorize the regions by type of metadata. As a non-limiting example, data storage device metadata, such as security keys, may be stored in the first metadata region 244 while user data metadata, such as forward pointers and version information, can be stored in the second metadata region 246.

By separating metadata into separate LBA regions 244/246, the provisioning module can segregate data write operations for user data, device metadata, and user data metadata. For instance, the provisioning module may only allow the first 244 or second 246 LBA regions to be written via metadata operations that are different than block writes of user data to LBAs of region 250 that exclude the metadata regions 244/246 and are conducted according to the data stages conveyed in FIG. 4. For data access read requests, it is contemplated that the provisioning module provides some, or all, of the metadata resident in the metadata regions 244/246 concurrently with the user data, but such block reading is not required and separate metadata read operations can be conducted for metadata versus user data.

In some embodiments, multiple hosts can concurrently be updating the configuration data of the metadata regions 244 and 246 while the data storage device resolves contentions between hosts through appropriate ordering of updates and while optionally enforcing unique access controls to user data by the respective hosts of the network. Such activity is in contrast to a host unlocking a region and allowing other hosts in the network to have access.

Figure 9:
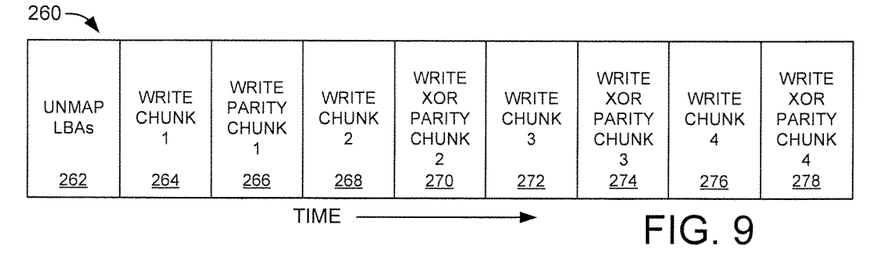
FIG. 9 is an operational timeline for an example data storage network.

FIG. 9 represents an example data storage network 260 arranged and operated in accordance with various embodiments. It is noted that the network 260 has a plurality of physically and electrically separate data storage devices interconnected via one or more computing entities as part of a distributed network. It is contemplated that each data storage device of the distributed network has a provisioning module that collectively provide RAID level 5 data storage. One or more hosts can connect to the distributed network and have block level addressing access to the respective data storage devices without data processing, provisioning, or storage in any computing entity of the distributed network.

When new write data is provided by a host to the distributed network, which is initially stored in the staging buffer of at least one data storage device so that a provisioning module can logically process and/or separate the write data into chunks. Upon receipt of write data being stored in a staging buffer, the provisioning module can designate a stripe of LBAs across multiple separate data storage devices and then unmap those LBAs in step 262. The unmapping of the entire stripe can be done concurrently, or consecutively, in the respective data storage devices.

A first data chunk is then written to a selected data storage device, such as the third device of five in the distributed network, in step 264, which may correspond with error detection when the write is issued to a mapped LBA. The first data chunk may be original host-provided user data that may, or may not, consist of metadata. Parity data of the first data chunk generated by one or more provisioning modules is written in step 266 to a different data storage device, such as the second device of the distributed network. Step 268 writes a new second chunk of data to a different data storage device, such as the fourth device in the network, prior to parity data of the second data chunk being compared in step 270, such as with an XOR function, to existing data in the assigned LBAs and subsequently written to a data storage device, such as the second device of the network.

In the event an LBA is mapped prior to a write to any data storage device, the provisioning module fails the write operation. However, a previously mapped LBA is part of the comparison of existing and new parity data in step 270, which corresponds to the provisioning module failing a parity comparison write if the LBA is recognized as unmapped. That is, the provisioning module can detect if a data write is improper if an original chunk is to be written to a mapped LBA or if parity data is to be written to an unmapped LBA. In some embodiments, a mapping structure, such as a flash transition layer (FTL), is immediately updated when data is written to a data storage device.

As new data chunks are processed and provisioned by the provisioning modules of the data storage devices, original data is written to different data storage devices of the distributed network and parity information for that data is compared and written to the second device of the network, as illustrated by steps 272, 274, 276, and 278 that sequentially, or concurrently, write third and fourth chunks of original data to the network. The use of a single data storage device for parity data while the original data is distributed across various devices of the network is not required or limiting. For example, parity data may also be distributed across multiple different data storage devices of the network.

Figure 10:
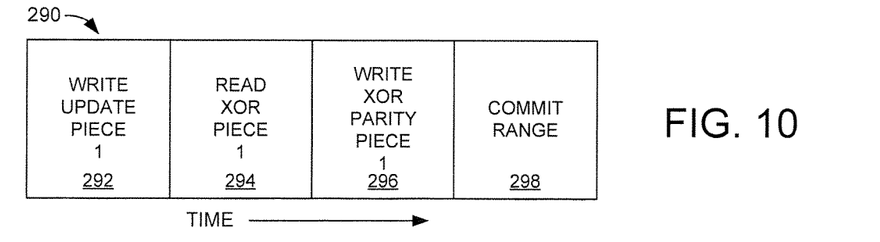
FIG. 10 shows an operational timeline for an example data storage network.

With the writing of new data to the memory of the distributed network, the unmapping of LBAs, writing of original data, and writing of parity data is relatively straightforward. When data already exists in the LBA(s) designated for storage, the provisioning module can conduct an updating operation that differs from writing data to an LBA without pre-existing data. FIG. 10 conveys an example data storage network 290 where a distributed network is employed in accordance with the embodiments of FIGS. 1-9.

In the network 290 of FIG. 10, write data from one or more hosts with block level address access is stored in the staging buffer of at least one data storage device where a provisioning module can direct a write update in step 292. The write update can correspond with pre-existing data stored somewhere in the distributed network. A write update may be written to the same LBAs as the pre-existing data or to different LBAs, such as LBAs located in a different data storage device as the pre-existing data that is being updated.

As with a write of system 260, writing to an unmapped LBA is recognized by the provisioning module and results in a failed write. The write data resident in the staging buffer of at least one data storage device is written in step 292 to a selected data storage device, such as a third device of five. It is contemplated that a data read request from a host for the data being updated returns the pre-existing data instead of the newer updated data.

Step 294 proceeds to execute a read comparison, such as an XOR, with the pre-existing data and returns the accumulation since the last commit command from a host. The read comparison can fail if the provisioning module detects LBAs to be read are unmapped. Next, parity information for the update data is written to a different data storage device, such as a second device of five, in step 296. The parity data can be compared to pre-existing parity data, such as with an XOR function, to efficiently write data that is new instead of re-writing the entire volume of parity data.

In response to step 298 where a commit command is issued from a host, a mapping structure is updated with the newly written data as well as with parity information. Some embodiments issue separate commit commands for the respective update data and parity information, but such is not required. The ability to update data efficiently with comparisons to existing data allows a provisioning module to provide high data throughput that takes advantage of the faster hardware architecture found in the data storage devices compared to the host and network entities.

Figure 11:
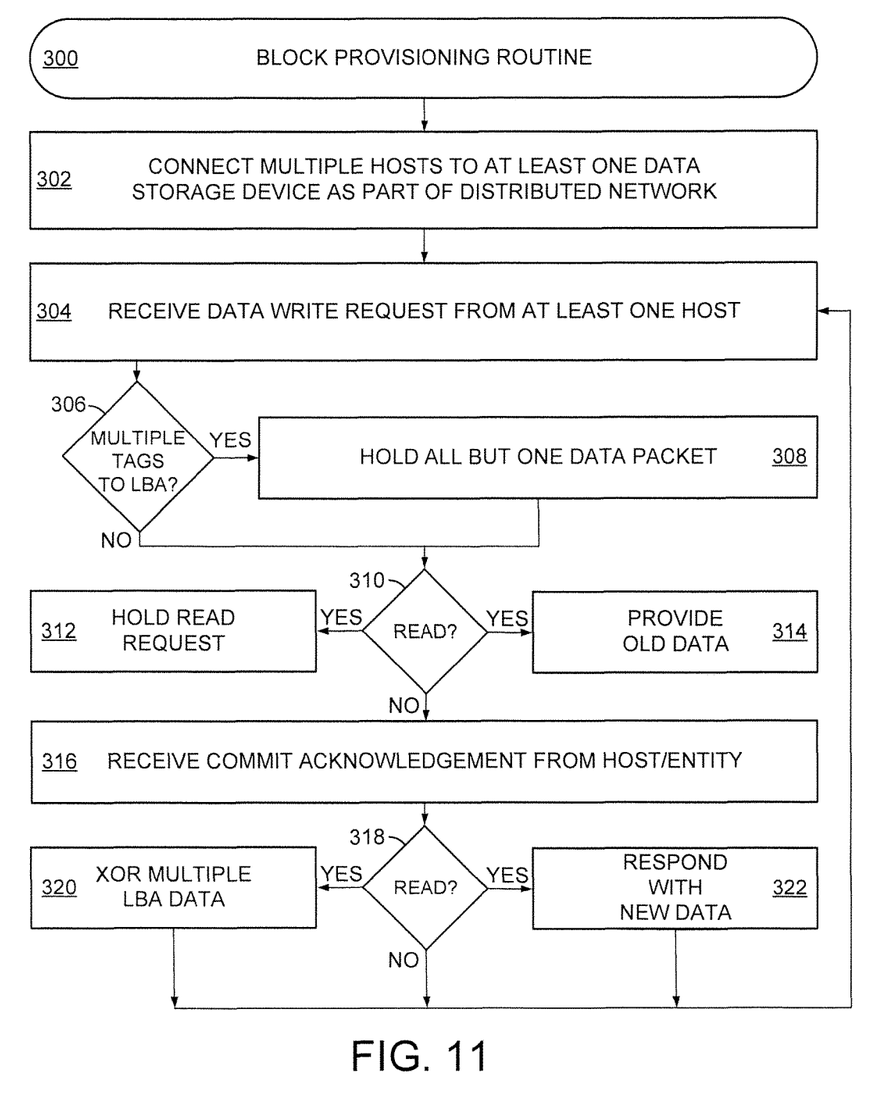
FIG. 11 provides a flowchart of an example block provisioning routine that can be carried out by the data storage system of FIG. 1.

An example block provisioning routine 300 is represented in FIG. 11 that can be carried out by the data storage system and networks of FIGS. 1-10. Connection of multiple hosts to at least one data storage device in step 302 allows step 304 to then receive a data write request. It is contemplated that one or more network entities are electrically positioned between the data storage device(s) and the hosts. Any network entities can be physical servers, switches, or virtualized components.

Each host is granted direct block level addressing and unlimited access to the respective data storage devices. The added access controls, limits, and response methods provided by the provisioning module of each data storage device allows more than one host to concurrently make block level requests without degrading network performance.

While step 304 can be consecutively, or cyclically, executed for any amount of time, a provisioning module can monitor the flow of data access requests in decision 306 to determine if several packets of data are directed to a particular LBA or LBA range. If so, step 308 holds all but one data packet while not acknowledging the other data packet(s) despite the other packet(s) being stored in the staging buffer. At the conclusion of step 308, or if no LBA(s) have multiple data packets waiting to be written in the staging buffer, decision 310 evaluates if any read requests have been issued by a host.

A read request can be serviced by one or more provisioning modules by holding the read request in step 312 or by responding to the request in step 314 with the pre-existing data stored on the LBA(s). It is contemplated that decision 310 can proceed to a read XOR function that responds to the read request with the comparison of the pre-existing data and the new data resident in the staging buffer. Once a commit command is received for a particular data context tag by a provisioning module in step 316, the data with a common context tag of the staging buffer is promoted to replace any pre-existing data of the assigned LBA(s). Such promotion corresponds with transferring the data to permanent memory of the data storage device from the staging buffer.

The commit command of step 316 can be directed to a single data storage device or a stripe of LBAs that span multiple different data storage devices. Decision 318 is triggered with a host read request after the host has committed the staged data to permanent memory in step 316. The provisioning module can return a comparison of newly promoted data to any other versions resident in the staging buffer in step 320, if any additional data versions are present. Otherwise, the read request is serviced with step 322 providing the newly promoted data, even if the data has not yet been transferred out of the staging buffer.

Figure 12:
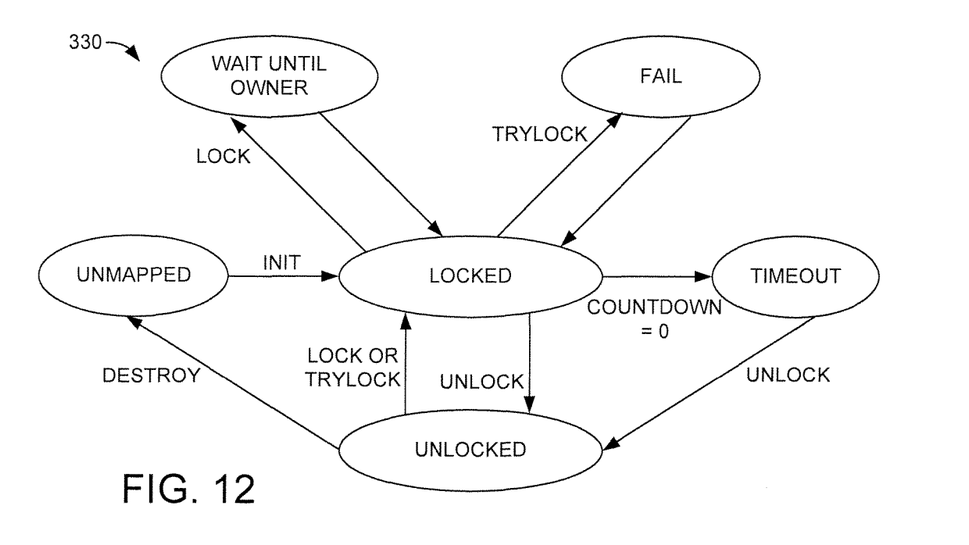
FIG. 12 is a block representation of an example provisioning module scheme that can be employed in the data storage device of FIG. 3.

FIG. 12 is a block representation of a scheme 330 executed by a provisioning module in accordance with some embodiments. The scheme 330 can utilize various commands, such as Initialize, Lock, TryLock, UnLock, and Destroy to transition data between states. Host operating systems or applications may issue these commands directly to the storage devices for host-to-host synchronization or application-to-application synchronization of shared data structures and resources.

Figure 13:
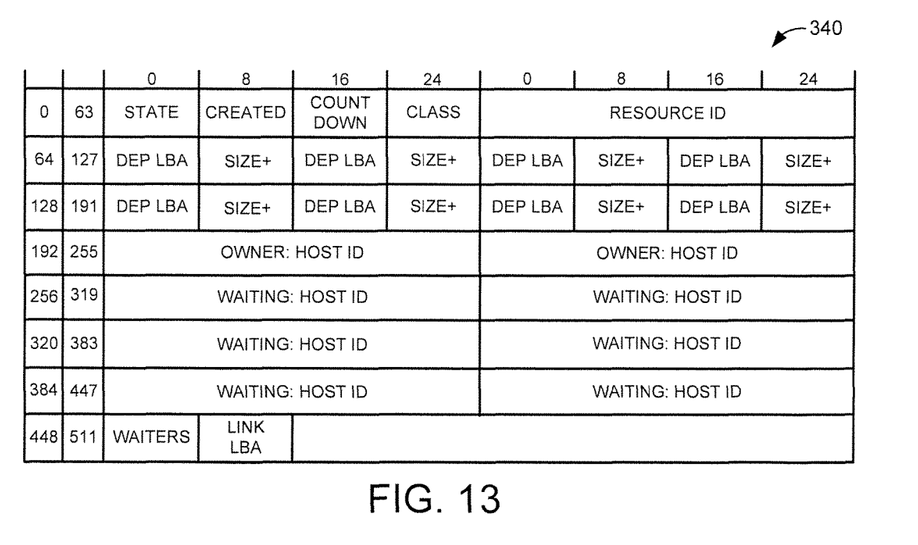
FIG. 13 displays an example data structure that may be utilized in the data storage device of FIG. 3 in accordance with some embodiments.

FIG. 13 displays an example data structure 340 that may be resident in a data storage device in accordance with various embodiments. The data structure 340 may reside within a single a 512 byte Linear Block Array element. Using assorted methods of barriers, such as semaphore and mutual exclusion (MUTEX) constructs, multiple hosts can request and obtain resource ownership or control with orderly contention resolved systematically by the storage device without host-to-host communication.

When data is characterized as STATE, a controller returns the current state of the data storage device mutex. A CREATED characterization corresponds with a timestamp of data storage device mutex creation either by a host or the device itself. A count down value is loaded by a host in the COUNTDOWN characterization, or the value can be defaulted and controlled by the data storage device. A logical identifier mutex method is present in the CLASS state and can advance to a decision to destroy the mutex upon a timeout.

The RESOURCE ID state corresponds with a host or application tag that is stored with mutex. The start of a dependent LBA range is denoted by DEP LBA and SIZE+ denotes the run length of the dependent LBA range. The SIZE+ identifier may also have a class field that could indicate alternative physical extents. A count of network hosts awaiting access is conveyed with WAITERS and a LINK LBA state corresponds with the address of the LBA with additional waiting host IDs and process IDs.

Through the various embodiments of the present disclosure, data memory provided by multiple data storage devices can be controlled with several hardware and/or software controllers resident on different hosts or different network entities. As a result, resources and access controls are optimized to take advantage of the faster data throughput provided by the data storage devices compared to hosts or network entities, which provides reduced deployment cost and heightened performance in fault tolerant multi-server shared storage environments.

By utilizing provisioning modules of the respective data storage devices in a distributed network, controller bottlenecks, latency between application and data is removed, power consumption can be reduced, controller management is removed, and the scalability of the network is increased compared to virtualized storage management where data is provisioned away from the data storage devices of the network. Compared to clustered file systems, the assorted provisioning module embodiments remove the latency and cost burden of storing block accessed allocation in the file system while removing storage server computing costs from the system controllers and memory.

The ability to provision data and control access at the data storage device level allows the respective devices in the distributed network to provision the method and state of synchronization operations between multiple hosts. With each data storage device having a provisioning module that can optimize data throughput with fast interface, channel, and bus technology, such as NVMe, network entities, like hardware and software RAID controllers, can simply distribute data instead of processing and provisioning the data, which eliminates bottlenecks and optimizes network performance.

Through the monitoring of the number of active data storage units in a network connected data storage system, a network controller can more intelligently direct data access requests through primary and back-end data paths. By responding to data access requests according to the current capabilities of the system instead of the size or number of pending data access requests, the bottlenecks associated with pending data access requests and fully utilized primary data paths are eliminated. The ability to proactively adapt to potentially changing system configurations and performance capabilities by utilizing back-end data paths allows a data storage system to maintain strict data access request metrics despite more data access requests than primary data paths to fulfill them.

What is claimed is:

1. An apparatus comprising a first data storage device connected to first and second entities as part of a distributed network, each entity having direct block level access to logical block addresses (LBAs) of the first data storage device, the first data storage device comprising a provisioning module and a staging buffer, the provisioning module configured to store and acknowledge non-volatile write data in the staging buffer in response to a write request to any LBA of a range of LBAs in the first data storage device, the provisioning module configured to return previously committed data resident in the range of LBAs instead of the write data resident in the staging buffer prior to receipt of a commit signal received from at least one entity for the write data and to return write data resident in the staging buffer after receipt of the commit signal.

2. The apparatus of claim 1, wherein a second data storage device is connected to the first and second entities as part of the distributed network.

3. The apparatus of claim 1, wherein the reading of any LBA of the range of LBAs is delayed until the commit signal is issued to the at least one entity by a host.

4. The apparatus of claim 1, wherein the first and second entities are each redundant array of independent devices (RAID) controllers.

5. The apparatus of claim 1, wherein one or more remote hosts are connected to the first entity.

6. The apparatus of claim 1, wherein the first data storage device has a peripheral component interconnect express (PCIe) bus employing a non-volatile memory express (NVMe) protocol.

7. A method comprising:
connecting first and second entities each to a data storage device as part of a distributed network, each entity having direct block level access to logical block addresses (LBAs) of the data storage device, the data storage device comprising a provisioning module and a staging buffer;
storing a first non-volatile data packet in the staging buffer as directed by the provisioning module in response to a write request to any LBA of a range of LBAs in the data storage device;
acknowledging the first non-volatile data packet with the provisioning module;
returning previously committed data resident in the range of LBAs instead of the first non-volatile data packet resident in the staging buffer; and
receiving a first commit signal from the first or second entity.

8. The method of claim 7, wherein the provisioning module executes an exclusive or (XOR) operation in response to a read request while the non-volatile data packet is stored in the staging buffer.

9. The method of claim 8, wherein the provisioning buffer responds to the read request with the non-volatile data packet stored in the staging buffer and the previously committed data stored in a non-volatile memory of the data storage device.

10. The method of claim 8, wherein the first non-volatile data packet is sent to the data storage device by the first entity and a second non-volatile data packet is concurrently sent to the data storage device by a second entity, the first and second non-volatile data packets each directed to a common LBA range.

11. The method of claim 10, wherein the first and second entities are not synchronized while the first and second non-volatile data packets are sent to the data storage device.

12. The method of claim 10, wherein the provisioning module conducts error detection in response to the write request being issued to a previously mapped LBA.

13. The method of claim 12, wherein the second non-volatile data packet is compared to the first non-volatile data packet upon a second commit signal from the first or second entity.

14. The method of claim 7, wherein a first host connected to the network entities as part of the distributed network has exclusive access to one or more LBAs in the data storage device.

15. The method of claim 14, wherein the first host and a second host concurrently control different first and second resources of the data storage device, access control of the first resource immediately altering access control of at least one dependent resource.

16. A method comprising:
connecting first and second entities each to a first data storage device and a second data storage device as part of a distributed network, each entity having direct block level access to logical block addresses (LBAs) of the first data storage device, the first data storage device comprising a provisioning module and a staging buffer; and
storing a first data packet in the staging buffer as directed by the provisioning module in response to a write request from the first entity;
returning previously committed data resident in the range of LBAs instead of the first data packet;
receiving a first commit signal from the first or second entity;
moving the first data packet from the staging buffer to non-volatile memory of the first data storage device;
storing a second data packet in the staging buffer as directed by the provisioning module in response to a second write request from the second entity, the first and second data packets designated by the provisioning module to a common LBA;
comparing the first data packet present in the non-volatile memory to the second data packet; and
writing less than all the second data packet to the non-volatile memory of the first data storage device in response to a second commit signal from the first or second entity.

17. The method of claim 16, wherein the provisioning module writes parity data of the first data packet in the second data storage device in response to the first commit signal.

18. The method of claim 16, wherein the second data packet is a result of the comparison between the first data packet and a third data packet resident in the non-volatile memory.

19. The method of claim 16, wherein the provisioning module assigns a logical address to the first data packet after the first data packet is stored in the staging buffer.

20. The method of claim 16, wherein the first and second entities send the respective first and second write requests along with the first and second commit signals without assigning a logical address.

* * * * *